US012644918B2

(12) United States Patent   (10) Patent No.:   US 12,644,918 B2
Baldauf et al.   (45) Date of Patent:   Jun. 2, 2026

(54) TESTING DEVICE AND METHOD FOR TESTING A HIGH OR MEDIUM-VOLTAGE CABLE

(71) Applicant: b2 electronics GmbH, Klaus (AT)

(72) Inventors: Stefan Baldauf, Zwischenwasser (AT); Christian Mathies, Bartholomaeberg (AT); Joseph Kruijen, Buch (AT)

(73) Assignee: b2 electronics GMbH, Klaus (AT)

( * ) Notice: Subject to any disclaimer, the term of this patent is extended or adjusted under 35 U.S.C. 154(b) by 191 days.

(21) Appl. No.: 18/609,722

(22) Filed: Mar. 19, 2024

(65) Prior Publication Data

US 2024/0319257 A1 Sep. 26, 2024

(30) Foreign Application Priority Data

Mar. 20, 2023 (DE) ..................... 10 2023 106 958.6

(51) Int. Cl.
*G01R 31/14* (2006.01)
*G01R 31/12* (2020.01)

(52) U.S. Cl.
CPC ......... *G01R 31/14* (2013.01); *G01R 31/1272* (2013.01)

(58) Field of Classification Search
CPC .... G01R 31/14; G01R 31/1272; G01R 31/58; G01R 31/52; G01R 31/083; G01R 31/50
(Continued)

(56) References Cited

U.S. PATENT DOCUMENTS 5,083,086 A * 1/1992 Steiner ................... G01R 31/11
379/22.03
6,344,748 B1 * 2/2002 Gannon ................. G01R 31/69
324/543
(Continued)

FOREIGN PATENT DOCUMENTS

CN 114740305 A 7/2022
DE 3737373 C2 2/1996
(Continued)

OTHER PUBLICATIONS

"IEEE Guide for Field Testing of Shielded Power Cable Systems Using Very Low Frequency (VLF) (less than 1 Hz)", IEEE Standards Association, 2013, pp. 1-49, New York, USA.
(Continued)

*Primary Examiner* — Roberto Velez
(74) *Attorney, Agent, or Firm* — Myers Wolin, LLC

(57) ABSTRACT

A testing device for testing a high or medium-voltage cable comprises a circuit arrangement with a test voltage generator, which comprises a low voltage-side earthing input and a high voltage-side output and is designed to provide a variable test voltage, a test specimen connection for connecting the high voltage-side output to a conductor of the cable, a protective earth connector for connecting to protective earth, a connecting conductor which electrically connects the low-voltage-side earth input to the protective earth connector, so that the connecting conductor represents a current collection point through which a measuring current flows during the test, and a high-frequency signal pick-up at the current collection point, at which a high-frequency pre-location signal is generated based on the measuring current. The testing device comprises evaluation electronics connected to the high-frequency signal pick-up for recording
(Continued)

the high-frequency pre-location signal and is designed for defect distance evaluation.

20 Claims, 6 Drawing Sheets

(58) Field of Classification Search
USPC .................................. 324/551, 543, 544, 555
See application file for complete search history.

(56) References Cited

U.S. PATENT DOCUMENTS

| | | | | |
|---|---|---|---|---|
| 7,952,362 B2 * | 5/2011 | Baldauf | ................. | G01R 31/14 |
| | | | | 324/543 |
| 2015/0109017 A1 * | 4/2015 | Szczechowski | ....... | G01R 31/62 |
| | | | | 324/756.05 |
| 2015/0316596 A1 | 11/2015 | Blank et al. | | |
| 2016/0238648 A1 * | 8/2016 | Stechemesser | ........ | G01R 31/14 |

FOREIGN PATENT DOCUMENTS

| | | | |
|---|---|---|---|
| DE | 19513441 A1 | 10/1996 | |
| DE | 102009037445 B4 | 7/2012 | |
| DE | 102012024560 B3 | 3/2014 | |

OTHER PUBLICATIONS

Office Action issued by the German Patent and Trademark Office for German Patent Application No. 102023106958.6, dated Mar. 1, 2024, with English translation attached.

"IEEE Guide for Fault-Locating Techniques on Shielded Power Cable Systems", IEEE Standards Association 1234, 2019,(Revision of IEEE Std 1234-2007), pp. 1-64, IEEE Power and Energy Society, IEEE, New York, USA.

"Fault location on land and submarine links (AC & DC)", B1 Insulated Cables, Cigre, Sep. 2019, Ref. No. 773; pp. 1-152.

* cited by examiner

TESTING DEVICE AND METHOD FOR TESTING A HIGH OR MEDIUM-VOLTAGE CABLE

CROSS REFERENCE TO RELATED APPLICATIONS

This application claims priority to German Application No. 10 2023 106 958.6, filed Mar. 20, 2023, the contents of which are incorporated by reference herein.

FIELD OF THE INVENTION

The present invention relates to a testing device for testing a high or medium-voltage cable, in particular for testing insulation in coaxial cables for power/energy distribution in electrical supply networks by means of VLF-testing methods. Furthermore, the invention relates to a method for testing, in particular for diagnosing and locating, a high or medium-voltage cable defect.

BACKGROUND

The testing of high or medium-voltage cables (also referred to herein as test specimen, for example, cables laid underground or passing through water as part of local/regional energy networks) includes testing for the purpose of identifying any existing defects or pre-damages (also referred to herein as a defect in a high or medium-voltage cable). Defects can form, for example, at the insulation of a high-voltage cable. A defect can be a defect in the cable insulation that causes a breakdown. A defect can also be a defect in the cable insulation that does not yet causes a breakdown or that causes a breakdown. These can be so-called water trees or electrical trees. In addition to the existence of a defect, it is also necessary to locate the position of the defect in order to rectify the defect. Particularly with cable lengths of several kilometers, it is advantageous to locate the position of the defect as quickly and precisely as possible.

With regard to the presence of a pre-damage, mobile VLF-testing devices enable a test specimen to be tested using a test voltage, e. g., in the range of 20 kVpeak to 120 kVpeak (generally not limited), the test voltage being generated with a high-precision voltage profile at a frequency in the range of 0.01 Hz to 1 Hz, the so-called Very Low Frequency (VLF), and applied to the test specimen as a power cable to the conductor with respect to protective earth. VLF-based testing methods are known and defined in IEEE 400.2, for example.

For voltage generation, VLF-testing devices include special VLF-test generators (also referred to as VLF high-voltage sources). A VLF-test generator can preferably comprise two high-voltage sources (transformers with cascade circuit) and an output amplifier (in the form of current sources), which together generate a very low-noise sinusoidal output voltage (the "test voltage"). Circuit arrangements for generating such test voltages are disclosed, for example, in DE 10 2012 024 560 B3 of the applicant or DE 195 13 441 A1.

For a diagnose of the presence of a pre-damage (e. g., water tree), a loss factor can be determined in a so-called tangent-delta-measurement. For a tangent-delta-measurement, the current through the defect-despite the test specimen being connected to protective earth—can be detected, i.e., without disconnecting the test specimen from the protective earth. For example, a current detection element for a tangent-delta-measurement (e. g., resistor as a current shunt) can be provided internally in a VLF-test generator, with which the current through the test specimen can be detected. For example, the current can be detected at a collection point in the VLF-test generator, through which the current flows from the test specimen back to the high-voltage cascade (see e. g., DE 10 2012 024 560 B3 for a particularly advantageous arrangement for a high-precision diagnostic measurement). The test current is detected, for example, with a resistor in the range from 0.01 kΩ to 1 kΩ in a frequency range up to usually 5 kHz (not more than 50 kHz) and is used to determine the power loss (resistive leakage current) via the phase shift.

In the state of the art, various so-called defect location methods are known for locating a defect in a test specimen. These methods are based on the determination that there is a defect in a power cable, which was detected, for example, by means of a voltage breakdown between the conductor and the shield during operation or during a test. To locate the defect, a voltage in the range of e. g., 8 kV to 40 kV is again applied to the test specimen using a high-voltage generator until a breakdown occurs again on the high-voltage cable. The devices are structurally limited with respect to the energy supply. Typically, energy e. g. in the 1000 kJ range (current pulse based on e. g., 10 μF to 20 μF in the kA range) can be provided. The current pulse triggers an oscillation (transient wave) in the test specimen, the course of which is recorded. The oscillation in the test specimen can be detected, for example, using a capacitive voltage divider that, in addition to the high-voltage generator, is connected externally (i.e., on the high-voltage side) to the test specimen for the voltage measurement. Alternatively, the oscillation can be detected by means of an inductance, which is provided externally (i.e., on the high-voltage side) on a supply line, for the measurement of the circulating current. The distance to the defect results from the frequency of the oscillation. For exemplary defect location methods, see, for example, IEEE 1234-2019, chapter 7.2.9 "Impulse current method (also surge pulse reflection)" and chapter 7.2.11 "Decay method" as well as CIGRE B1 773 September 2019, chapter 2.3.5 "Decay method and differential decay method" or chapter 2.3.6.1 "Impulse current method". All these defect location methods are based on capacitive (decay method) or inductive (impulse current method) coupling-out outside the VLF-test generator, as also described schematically in the arrangement in DE 10 2009 037 445 B4 (external coupling elements for voltage or current as well as separate unit for breakdown detection).

The applicant has recognized the disadvantages of these defect location methods that are based on externally attached means. In particular, the attachment for a correct current measurement is inaccurate and limited in sensitivity.

SUMMARY

One aspect of this disclosure is based on the objective of providing a device and a method for easy-to-perform defect pre-location, which can also be performed, for example, during a cable testing process. In particular, advantages have been recognized for a defect pre-location, which can already be carried out during the test, and by which a growth of the defect can be reduced or avoided if the defect pre-location can already be completed before a breakdown. Such a diagnosis without a forced breakdown can partially preserve the insulation of a partially defective cable, delay the replacement of the defective cable and, in particular, save time if testing and diagnosis can be carried out simultaneously.

A further aspect of this disclosure is based on the objective of providing a compact and cost-effective configuration of a testing device for testing a high or medium-voltage cable, which enables test procedures that are safe, simple and cost-effective to be carried out.

At least one of these objectives may be solved by a testing device for testing a high or medium-voltage cable and by a method.

In one aspect, a testing device for testing a high or medium-voltage cable, in particular using a very low frequency (VLF) testing method, has a circuit arrangement. This comprises a test voltage generator, which comprises a low-voltage-side earthing input and a high-voltage-side output and is configured to provide a variable test voltage at the high-voltage-side output, a power connection for connecting the test voltage generator to a supply voltage source, a test specimen connection for connecting the high-voltage-side output to a conductor of the high or medium-voltage cable, in particular via a measuring connection cable, and a protective earth connection for connecting to protective earth. The testing device further comprises a connecting conductor that electrically connects the low-voltage-side earthing input to the protective earth connection, so that the connecting conductor represents a current collection point through which a measuring current flows during the test of the high or medium-voltage cable, which is formed between the low-voltage-side earthing input and a shield of the high or medium-voltage cable, which shield is also connected to protective earth, as well as a low-frequency signal pick-up at the current collection point, at which a low-frequency diagnostic signal is generated based on the measuring current, and a high-frequency signal pick-up at the current collection point, at which a high-frequency pre-location signal for measuring a transient high-frequency oscillation is generated based on the measuring current. Furthermore, the testing device comprises an evaluation electronics, which is connected to the low-frequency signal pick-up for recording the low-frequency diagnostic signal and is configured for a VLF phase rotation measurement and which is connected to the high-frequency signal pick-up for recording the high-frequency pre-location signal and is configured for a defect distance evaluation.

In a further aspect, a method for testing a high or medium-voltage cable, in particular using a testing device disclosed herein, comprises the following steps:

connecting a conductor of the high or medium-voltage cable to a test specimen connector of the testing device, wherein a shield of the high or medium-voltage cable is connected to protective earth, generating a very-low-frequency (VLF) test voltage with a test voltage generator of the testing device and coupling the VLF-test voltage into the high or medium-voltage cable, measuring a transient high-frequency oscillation with a high-frequency signal pick-up at a current collection point of the high-voltage source, wherein a high-frequency pre-location signal is generated based on a measuring current flowing through the current collection point, and evaluating the high-frequency pre-location signal in an evaluation electronics (electronic evaluation unit) of the testing device with regard to a defect distance.

In a further aspect, a method for testing a high or medium-voltage cable, in particular using a testing device disclosed herein, has the following steps:

with a test voltage generator having a high or medium-voltage cable connected, causing a measuring current in a connecting conductor, which connects a low-voltage-side earthing input of the test voltage generator to protective earth via a protective earth connection, the connecting conductor representing a current collection point through which the measuring current flows, and the measuring current being formed between the low-voltage-side earthing input and a shield of the high or medium-voltage cable, which is also connected to protective earth, for a VLF phase rotation measurement, generating a low-frequency diagnostic signal associated with the measuring current with a low-frequency signal pick-up at the current collection point, for a defect distance evaluation, generating a high-frequency pre-location signal associated with the measuring current with a high-frequency signal pick-up at the current collection point, the high-frequency pre-location signal being generated continuously during the VLF phase rotation measurement, and evaluating the high-frequency pre-location signal in an evaluation electronics with respect to a defect distance.

In some embodiments of the testing device, the circuit arrangement can be configured to, using the variable test voltage, simultaneously generate the low-frequency diagnostic signal for an insulation test of the high or medium-voltage cable via the VLF phase rotation measurement and the high-frequency pre-location signal for defect pre-location via the measurement of transient high-frequency oscillations. Alternatively or additionally, the low-voltage-side earthing input is only connectable to protective earth via the connecting conductor.

In some embodiments, the high-frequency signal pick-up can comprise an electrical and/or magnetic coupling with the connecting conductor and the coupling can be configured to detect the pre-location signal with frequencies in the range from 20 kHz to 2 MHz with a sampling rate with frequencies in the range from 1 MHz to several 100 MHz. The coupling can be configured as an inductive coupling, in particular via a coil such as a Rogowski coil or (air) coil with or without an inductive core. Furthermore, the high-frequency signal pick-up can be arranged to continuously detect a high-frequency current oscillation in the connecting conductor. The high-frequency current oscillation can be detectable in particular in the event of a breakdown of the insulation in the high or medium-voltage cable or a high-frequency current oscillation can be detectable, which is associated with an impending breakdown.

In some embodiments of the testing device, the evaluation electronics can be configured to derive, from the pre-location signal, one (or more) distance value(s) associated with the high-frequency current oscillation, evaluate the distance value(s) with regard to plausibility, taking into account a known parameter of the high or medium-voltage cable, in particular a length of the high or medium-voltage cable, and to output a defect distance value assigned to the high or medium-voltage cable.

In some embodiments of the testing device, the test voltage generator can generate the test voltage for a tangent-delta-measurement. The low-frequency signal pick-up can be configured to detect an instantaneous value of a current in the connecting conductor. In particular, it can comprise an impedance in the connecting conductor, in particular a parallel circuit of a resistor and capacitor.

In some embodiments, the evaluation electronics can be configured to determine, from the diagnostic signal, a loss factor associated with the high or medium-voltage cable, and in particular is configured to detect low frequencies of the diagnostic signal in the range from 0.01 Hz to 1 Hz with a sampling rate with frequencies in the range from 500 Hz to 10 KHz.

In some embodiments, the evaluation electronics can comprise at least one analog and/or digital signal processing unit and/or a processor and/or a buffer memory.

In some embodiments, the testing device can further comprise a control with a memory and a display, wherein the control is connected to the evaluation electronics and is set up to store a defect distance value in the memory, to output it on the display and/or to use a defect distance value as a control parameter for controlling the testing device, in particular for aborting a VLF-test.

In some embodiments, the testing device may further comprise a housing in which the circuit arrangement and the evaluation electronics and optionally a control are arranged.

In some embodiments of the methods, the processor may apply a discrete Fourier transform to the measurement data set to identify the plurality of dominant oscillations and generate a transformed measurement data set in the frequency domain, recognize at least one dominant oscillation frequency, transform the at least one dominant oscillation frequency back into the time domain, and derive it as the at least one dominant oscillation for correlating with the temporarily stored (cached) measurement data set.

In some embodiments of the methods, the processor may apply a continuous wavelet transform to the measurement data set to identify the plurality of dominant oscillations, recognize at least one dominant characteristic in the spectrum, transfer the at least one dominant characteristic into the time domain, and derive it as the at least one dominant oscillation for correlating with the temporarily stored (cached) measurement data set.

In some embodiments of the methods, the high-frequency pre-location signal can be evaluated with respect to a defect distance in such a way that a defect distance value is calculated for a fundamental oscillation having a plausibility above a threshold value. In addition or alternatively, a parameter assigned to the fundamental oscillation, such as oscillation frequency, periodicity and quality specification, and/or the defect distance value can be stored in a memory, saved in a measurement log, output on a display, and/or fed to a control of the testing device as a control parameter, in particular for aborting a VLF-test.

In particular, disclosed herein is a VLF-testing device which, in addition to the tangent-delta-measurement, enables an integrated defect pre-location measurement, which is performed in the form of continuous sampling of high-frequency data in the frequency range from e. g., 0.01 MHz to 1 MHz (corresponding to defect distances in the range from e. g., 10 km to 40 m) with sampling rates of up to 2 MHz and more (e. g., 4 MHz) and which does not require a preceding breakdown detection. A target core area of the defect pre-location lies usually in the range from 100 m to 10 km. Due to the different measurement signals, the bandwidth required for a defect pre-location measurement is therefore spectrally decoupled from the tangent-delta-measurement. The defect pre-location measurement takes place in an independent signal pick-up and is subject to a specific signal evaluation that does not require any breakdown detection.

As the tangent-delta-measurement, the defect pre-location measurement can be carried out at a low voltage potential (preferably close to protective earth potential)—in the VLF-testing device. In contrast to the coupling-out of signals in the high-voltage path, no spatially voluminous expansion of a measuring stet up is necessary in this case.

The concepts described herein may have the following advantages over the prior art or avoid corresponding disadvantages of the prior art:

Fault location using the external pre-location method according to the state of the art can use high capacities that are discharged to the cable in order to ignite a defect and trigger the oscillation. The discharge of such high energies can further damage or destroy the defect and the adjacent areas in addition to the defect already present.

One of the weaknesses of the state of the art with regard to the method is that the evaluation is usually carried out in the time domain. However, the resulting oscillation often consists of a signal with many harmonics and interfering signal components.

In an external pre-location method according to the state of the art, the voltage limitation is restricted by large components; for example, defect location in the state of the art is usually limited to maximum voltages of 32 kV or 40 kV, for example, as otherwise the capacitors for discharging into the cable would become disproportionately large.

In the new approach described herein, such large capacitors are not required; instead, the given capacity of the cable itself can be used. This reduces the risk of secondary damage and the voltage to be used is not limited. In other words, the maximum test voltage of the generator can be utilized. A further advantage results from the usability of the feature that the energy in a capacitive element (such as a cable) increases as the square of the voltage and that higher breakdown voltages can also trigger better detectable oscillations.

In an external pre-location method according to the state of the art, a trigger pulse is waited for during defect location by means of capacitors or built-in breakdown detection, which initiates an evaluation. This is accompanied by the disadvantage that at the first moment, due to the so-called ignition delay (caused by the necessary charging of the connection cable), it is not unambiguous whether only the discharge of the capacitor or already a breakdown is driving the current. In other words, a current may already be flowing that activates an evaluation, but a spark that triggers the desired oscillation to be detected has not yet formed. In the state of the art, this circumstance requires the operator to have a good knowledge of evaluation.

With the integrated evaluation according to the new approach described herein, there is no need for breakdown detection, as the cable to be tested is intrinsically charged by the VLF-test taking place (there is no ignition delay) and detected oscillations can be continuously sampled, evaluated and assessed for plausibility. For example, if an evaluable oscillation occurs, it can be stored and further processed while the sampling is already being actively carried out again. This means that a trigger mechanism, which explicitly signals the start of a breakdown, can be dispensed with.

With an external pre-location method according to the state of the art, erroneous trigger events can occur. In other words, methods according to the state of the art have the difficulty of switching the breakdown detection within a range that corresponds to the leveling and can be well detected by measurement. Depending on the current intensity, defect location may have to be carried out several times (manually or automatically) in order to determine a suitable leveling for the external pre-location method according to the state of the art.

In the new approach described herein, the design of the VLF HV generator is such that the current oscillates obligatorily both positively and negatively at the current collection point; therefore, the current can be detected inductively over a very wide current range without the need for a adjusting the leveling with multiple breakdowns, as a magnetic saturation effect can be largely prevented.

A further weakness of the evaluation methods according to the state of the art is that the evaluation is usually carried out in the time domain. However, the resulting oscillation consists of a signal with many harmonics and interfering signal components.

In the new approach described herein, a method is implemented that makes it possible to detect superimposed oscillations within one signal, as it can occur in the case of a short spark or multiple breakdowns, for example. This increases the quality when assessing the evaluation.

BRIEF DESCRIPTION OF THE DRAWING

Disclosed herein are concepts that allow at least partial improvement of aspects from the prior art. In particular, further features and their usefulness will result from the following description of embodiments based on the figures. From the figures show.

DETAILED DESCRIPTION OF THE PREFERRED EMBODIMENTS

The applicant recognized that a VLF-testing device can be used to localize a defect in a test specimen. In particular, by extending a VLF-HV-generator, which already has an integrated tangent-delta diagnosis function, there can be performed a data acquisition and evaluation to determine the defect distance in parallel with the tangent-delta test and diagnosis with regard to a possible defect in the test specimen. If a breakdown should occur in the insulation or, potentially also in a preliminary phase of a breakdown, an evaluation for determining the defect distance can be carried out at the same time as the tangent-delta test. For the pre-location, a high-frequency oscillation in the form of a high-frequency pre-location signal is recorded in addition to the low-frequency diagnostic signal recorded during the VLF-test for the tangent-delta diagnosis, whereby the pre-location signal can be triggered in connection with a defect, in particular when a breakdown occurs. If a "correct" oscillation frequency can be associated to the oscillation, the respective periodicity is proportional to the distance to the location of the defect along the cable.

The embodiments of the current disclosure make particular use of the fact that the current measurement in a VLF-HV-generator already takes place at a collection point. If a defect occurs on a power cable during a VLF-test (e. g., a breakdown), the resulting oscillation will also necessarily pass through this collection point. At the collection point, a signal of the oscillation can, for example, be detected inductively/magnetically by means of a coil (e. g., Rogowski or air-core coil with or without an inductive core, exemplary inductances of 0.1 µH to 10 µH, in particular 1 µH to 6 µH, and a bandwidth of several MHz) or alternatively voltage-related via a current shunt. As the current collection point is only available internally in the VLF-HV-generator, this location offers equally the possibility of using the measuring current for tangent-delta diagnostics as well as for defect location.

Thus, the embodiments described herein are further based on the realization with regard to picking up the oscillation signal. This is because the oscillation signal cannot simply be picked up, for example, at the high-voltage connection cable, as the current can circulate via several protective earth-related connections, so that, with such a signal pick-up, the resolution may not be sufficient or correspondingly higher pulse currents would have to be generated in order to achieve a measurable oscillation signal.

The concepts for defect pre-location described herein are in particular unique in that the clever positioning of the oscillation detection in the current measuring path of a VLF-HV-generator (i.e., at the current collection point) makes it possible that, in the event of a breakdown, one can directly deduce a distance to the location of the defect during the test.

Figure 1:
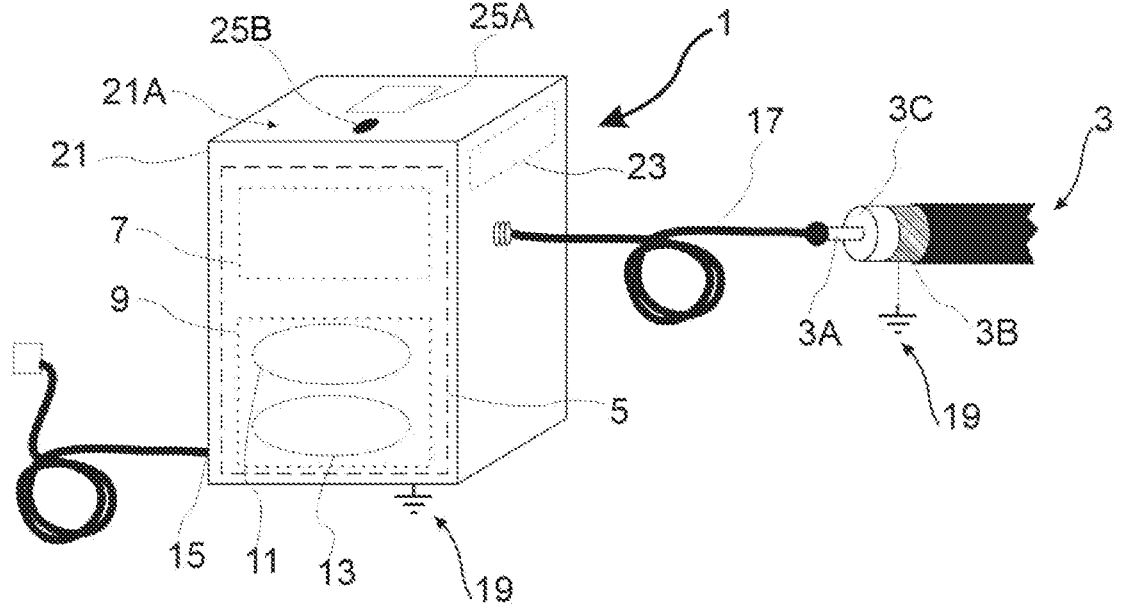
FIG. 1 is a schematic representation of an exemplary testing device for testing a high or medium-voltage cable according to the inventive concept.

FIG. 1 shows a schematic representation of a portable testing device 1 for testing a test specimen 3, e. g., a high or medium-voltage cable such as a coaxial cable, according to this disclosure. The testing device 1 comprises a circuit arrangement 5, essentially a VLF-test voltage generator 7 for generating a suitable (VLF) test voltage, and (measurement and) evaluation electronics 9 coupled to the circuit arrangement 5 and integrated into the testing device. The evaluation electronics 9 is set up both for a tangent-delta-measurement (tangent-delta-measuring unit 11) and for defect pre-locating (defect pre-location unit 13). The hardware (computing unit), on which the evaluation electronics 9 is based, has, for example, digital processor systems with microprocessor circuits having data inputs and control outputs, which are operated in accordance with computer readable instructions stored on a computer-readable medium. Typically, the evaluation electronics 9 comprises high computing power for real-time analysis of the continuously acquired and evaluated data sets as well as long-term (non-volatile) memory for storing the program instructions and very fast short-term (volatile) memory for storing acquired data and evaluation results during (or resulting from) the data acquisition and data processing of low-frequency and/or high-frequency signals described below.

Via, for example, the mains/power grid (generally a supply voltage source), the testing device 1 is supplied with power (power connection 15). A conductor 3A of the test specimen 3 is connected to the testing device 1 via a (HV) connection cable 17 (with exemplary lengths of 5 m to 15 m). A shield 3B of the test specimen 3 as well as the circuit arrangement 5, as explained in more detail below, are connected to protective earth 19, whereby the power connection 15 can also carry a protective earth 19 (see also FIG. 2). An insulation 3C to be tested is located between the conductor 3A of the test specimen 3 and the shield 3B.

The circuit arrangement 5 is arranged in a housing 21 of the testing device 1 and may comprise electronic components such as a signal processing unit with operational amplifiers, at least one integrator, a sample and hold element, at least one analog-to-digital converter for digitization for further processing in a processor, which has at least one memory for storing sampling data (measurement data). The circuit arrangement 5 can also be connected to or (partially) integrated into a control 23 of the testing device 1, the control 23 being provided in the testing device 1 or provided wholly or partially outside the testing device 1. The control 23 in turn generates a test voltage together with the high-voltage sources contained in the circuit arrangement 5 by providing the power for the current sources required to regulate the test voltage, for example, via a transformer and downstream cascade multipliers.

On the upper side 21A of the housing 21, an operating display 25A (display) is provided for displaying the test data obtained and at least one operating element 25B for setting a measurement parameter (indicated schematically in FIG. 1). The operating display 25A and the operating element 25B form, for example, a user interface of the control 23.

Figure 2:
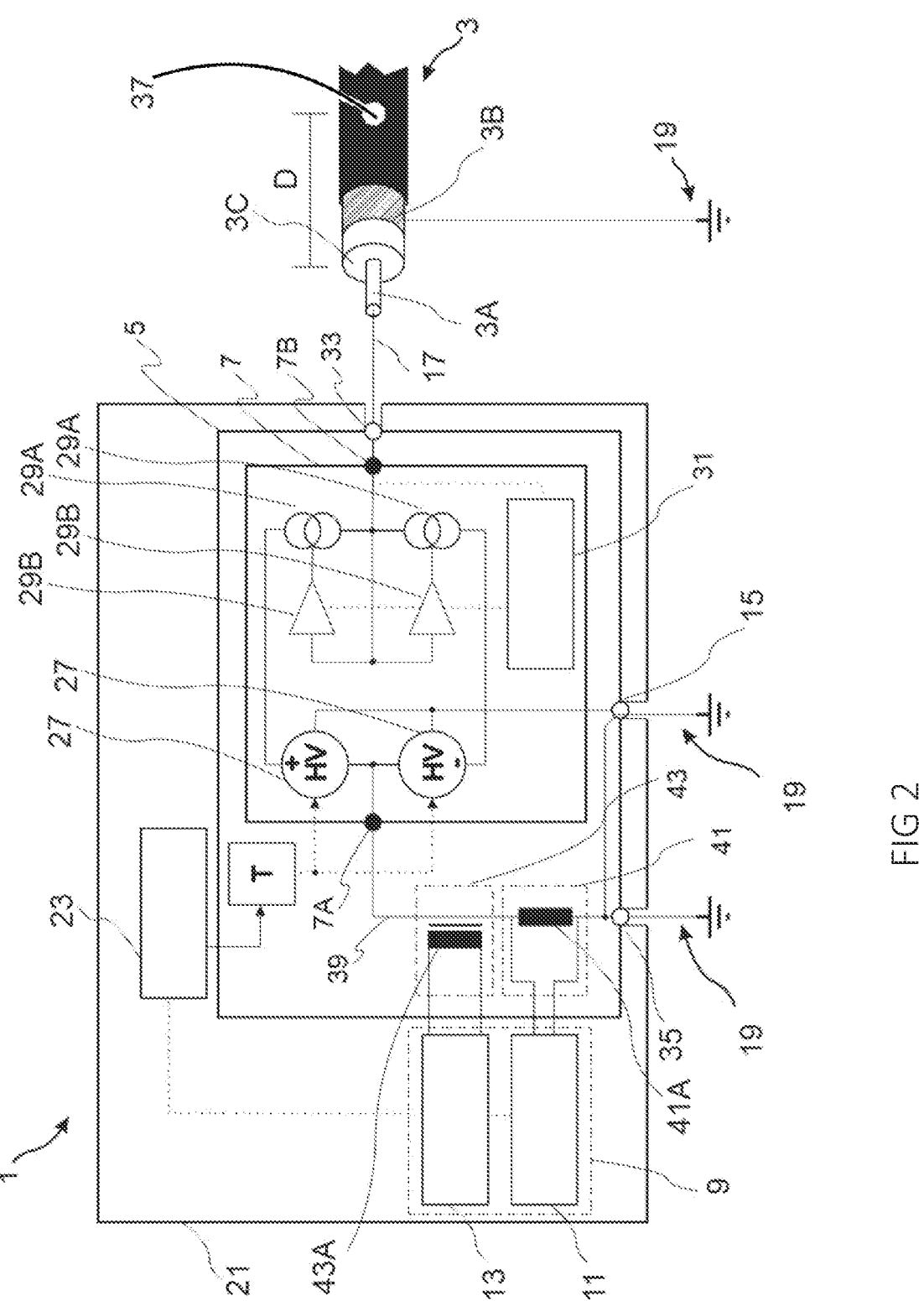
FIG. 2 is a schematic representation of an exemplary circuit arrangement in a testing device for testing a high or medium-voltage cable.

FIG. 2 shows an exemplary circuit diagram for the circuit arrangement 5 of the testing device 1 shown in FIG. 1 with the test specimen 3 connected via the connection cable 17. In the circuit arrangement 5, the test voltage generator 7 (test voltage generator unit) comprises, for example, two high-voltage sources 27, which are supplied with energy via the power connection 15 and are set up to provide a positive (+) or negative (–) high voltage of variable amplitude at their respective outputs, for example, by operating a modulation with a multiple of the frequency of the power grid. A high-voltage switch arrangement 29 is provided between the outputs of the two high-voltage sources 27 and the test specimen 3, it is acted on the high-voltage switch arrangement by means of a control regulation 31 for the defined charging and discharging of the test specimen 3, which represents a certain capacitive load. The control regulation 31 is set up to ensure a, preferably sinusoidal, voltage profile on the test specimen 3.

In the exemplary embodiment shown in FIG. 2, the high-voltage switch arrangement 29 comprises, for example, two semiconductor switch cascades 29A, each with an amplifier 29B, the control regulation 31 acting on two semiconductor switch cascades 29A. Furthermore, the high-voltage sources 27 are controlled by the control 23 using a clock signal generator T, so that the two high-voltage sources 27 can each provide a test voltage that is synchronized using the clock signal generator T, definable in terms of waveform and amplitude, advantageously edge-free and, in particular, sinusoidal, and not influenced by the control regulation 31.

For further details on generating and regulating the test voltage, it is exemplarily referred to DE 10 2012 024 560 B3 and DE 195 13 441 A1, mentioned above.

Essential for the concepts described herein is that the test voltage generator 7 comprises a low-voltage-side earthing input 7A and a high-voltage-side output 7B. The output 7B is electrically connected to a test specimen connection 33, to which the conductor 3A of the test specimen 3 is electrically connected for testing. The test voltage generator 7 is grounded at the low-voltage-side earthing input 7A via a protective earth connection 35 (internal earth potential during operation). For the cable to be tested and, in particular, for the test, also the shield 3B (sheath) of the test specimen 3 is also connected to protective earth, so that the shield 3B and the VLF-testing device 1, in particular the test voltage generator 7, are connected to a common protective earth. Particularly when testing high or medium-voltage cables laid in the ground, the shield 3B is connected to earth potential (protective earth 19) at the beginning and at the end. In the event of a defect 37 in the test specimen 3, if the protective earth connection 35 is connected to the same earth potential (protective earth 19), an electrical circuit can form through which a measuring current can flow and which extends from the test voltage generator 7 via the test specimen 3, in particular the defect 37, and through the protective earth connection 35 via the earth input 7A back to the test voltage generator 7.

The measuring current is accessible at a connecting conductor 39, which electrically connects the low-voltage-side earth input 7A to the protective earth connection 35 (internal earth potential during operation), for a measurement within the testing device 1 and in a low-voltage environment. The connecting conductor 39 thus represents a current collection point for measuring the measuring current and is used for a low-frequency signal pick-up 41, for example via an impedance 41A, to generate a diagnostic signal. The diagnostic signal is used as part of analog and/or digital signal processing in the tangent-delta measuring unit 11 to determine the phase and, thus, the power loss.

The concepts described herein now also use the current collection point for defect pre-location, in which, to generate a high-frequency pre-location signal, a high-frequency signal pick-up 43, for example, inductively via a coil 43A, is positioned in the low-voltage environment of the connecting conductor 39. The high-frequency signal pick-up 43 can be positioned along the connecting conductor 39 before or after the low-frequency signal pick-up 41. The background to this is that in the event of a breakdown at the defect 37 or during the formation of a breakdown or in the event of a correspondingly high-energy partial discharge, a high-frequency oscillation is formed, the frequency of which depends on a position of the defect 37 in the test specimen, in particular on a distance D of the defect 37 from the test specimen connection 33 (understood by the skilled person as given by a distance value of the defect-defect distance value). Information about this high-frequency oscillation can be obtained via the high-frequency pre-location signal in the evaluation electronics 9, in particular with an analog and/or digital signal processing in the defect pre-location unit 13. The information can flow into the control of the testing device 1 or be output/stored to a tester as part of a measurement protocol.

Information regarding defect pre-location can be obtained continuously during the tangent-delta-measurement, as the high-frequency pre-location signal can be continuously recorded and evaluated. The evaluation includes, for example, a plausibility check for meaningful defect distances by obtaining fundamental frequencies from the high-frequency pre-location signal, which are compared with the cable length.

Figure 3:
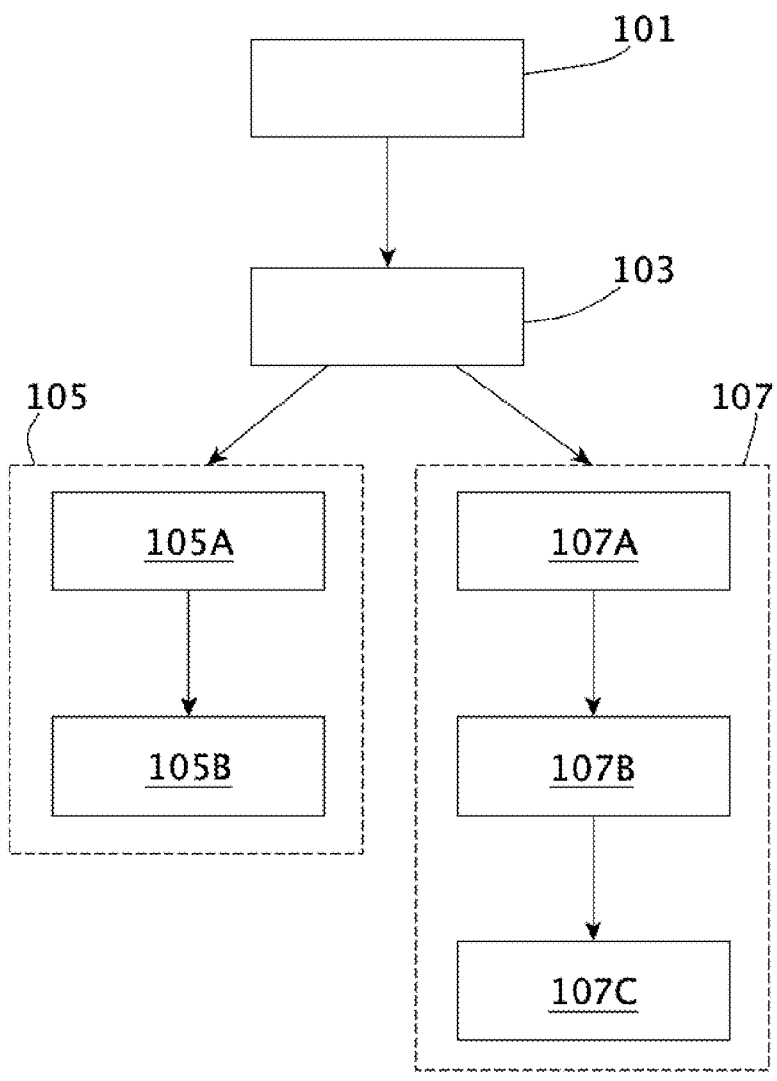
FIG. 3 is a flow chart of an exemplary sequence for testing insulations in coaxial cables.

FIG. 3 illustrates in a flow chart the process of testing insulation in, e. g., coaxial cables for power/energy distribution in electrical supply networks. In general, information on the insulation is obtained for testing and diagnostic measurement by means of a phase rotation measurement (tangent-delta-measurement) and a measurement of fast (high frequency), transient oscillations during or even before a breakdown of the cable insulation, and, in particular, is evaluated for distance calculation (pre-location).

For the test, the conductor 3A of the test specimen 3 is connected to a test specimen connection 33 of the testing device 1 (for example, via the connection cable 17) and the shield 3B of the test specimen 3 is already connected to protective earth 19 in the mounted state of the test specimen or is connected to protective earth 19 (step 101).

The test voltage, in this case a very-low-frequency (VLF) test voltage, is generated by the (clocked) test voltage generator 7 and is coupled into the test specimen 3 (step 103). The test voltage varies sinusoidally with a frequency of 0.01 Hz to 1 Hz at a voltage amplitude typically in the range from 20 kVpeak to 120 kVpeak, in particular, from 40 kVpeak to 100 kVpeak. To generate a high-quality envelope profile, the clock signal generator T supplies a time base for clocking the high-voltage sources 27, so that the sinusoidal test voltage can be generated at the output 7B of the test voltage generator 7 by semiconductor switch cascades 29A (as current sources) via the control regulation 23.

The voltage applied to the test specimen 3 exposes the insulation 3C of the test specimen 3, which is arranged between conductor 3A and shield 3B, to a defined field strength and enables the test of the insulation 3C. In order to build up the voltage at the test specimen 3, a controlled current flows, starting from the semiconductor switch cascades 29A (as current sources), through the test specimen 3, which forms a closed circuit via the protective earth, in particular the protective earth connection 35, back to the test voltage generator 7 (the high voltage sources 27).

To determine the loss factor (step 105), an impedance (as an example of a low-frequency signal pick-up), preferably a parallel circuit comprising a resistor and capacitor, and by means of signal processing carried out in the evaluation electronics 9, an instantaneous value of the current strength, a profile of the current strength and its phase position are determined and forwarded to the control. Thereby, a low-frequency diagnostic signal assigned to the measured current is, in particular, generated for a phase rotation measurement with a low-frequency signal pick-up at the current collection point (step 105A) and evaluated by the evaluation unit with regard to the phase position and the loss factor (step 105B). The determination of the loss factor and the underlying arrangement is preferably configured to detect and evaluate low frequencies associated with the measuring current in the range of the diagnostic signal 0.01 Hz to 1 Hz. For example, a digital sampling rate lies at frequencies in the range from 500 Hz to 10 KHz.

For defect pre-location (step 107), high-frequency oscillations are measured via an inductive coupling (as an example of a high-frequency signal pick-up) (step 107A), and a high-frequency pre-location signal is generated (step 107B) and evaluated with regard to a distance of a defect by means of signal processing carried out in the evaluation electronics 9 (step 107C). In particular, currents are recorded continuously and, thus, also in the event of a breakdown of the insulation 3C in the test specimen 3 or even before the breakdown, and are continuously evaluated for plausibility according to the known parameters of the test specimen 3 (such as the length). The inductive coupling is preferably set for the frequencies associated with the measuring current during breakdown (transient wave, oscillation) in the range from 20 kHz to 2 MHz. For example, a digital sampling rate lies at frequencies in the range from 1 MHz to several 100 MHz.

Figure 4:
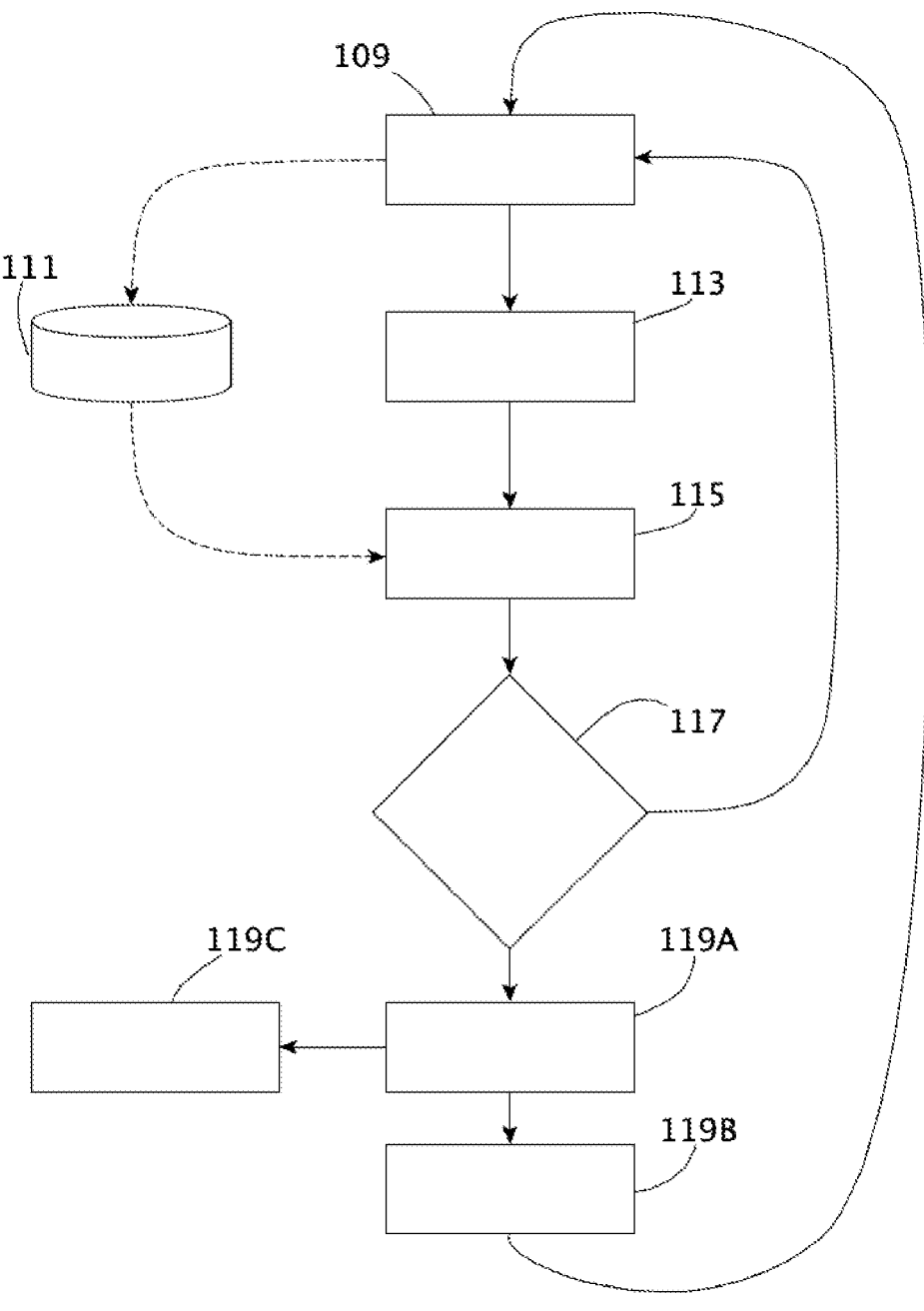
FIG. 4 is a flow chart illustrating an exemplary measurement process according to the inventive concept.

As shown in FIG. 4 in an exemplary flow chart, the signal processing in step 107C is used for the detection of traveling waves. The signal processing includes, for example, continuous sampling of the defect pre-location signal, optionally with windowing of the pre-location signal (step 109—"permanent sampling and framing") and (intermediate) storage of the continuously resulting measurement data in a memory/ring buffer, for example a cyclic memory/ring buffer (step 111—"storing in cyclic buffer"). Using the windowing, a, for example, section of the cyclically recorded signal can be prepared for further signal processing.

Furthermore, the signal processing comprises an identification step (step 113—"identifying fundamental waves"), in which one or more dominant oscillations and their parameters (such as frequency, phase position and amplitude, as well as amplitude ratio) can be determined from the signal. As a result, the identification step can provide oscillation data in a time domain, for example, for a back-transformed time domain section, which is used for subsequent evaluation calculations.

For example, a correlation of identified dominant oscillations with the original measurement data (step 115—"performing correlation of fundamentals") may be performed to evaluate the oscillation data (in particular to determine the exact position of the oscillation to be considered in the time domain), in order to select or confirm the most suitable oscillation(s), and preferably to identify the oscillation that best matches the measurement data. In general, a correlation is a measure of the agreement between the measurement signal and the identified oscillation.

Finally, parameters such as cable length and wave propagation velocity can be used to check an identified dominant oscillation for plausibility with regard to the test specimen (step 117—"evaluating parameters of fundamentals"). If the plausibility check is successful (e. g., the determined plausibility is above a threshold value), this dominant oscillation represents a fundamental oscillation that relates back to a defect.

If a suitable oscillation is found (for example, if a plausibility is above a threshold value), the parameters determined for the oscillation, such as oscillation frequency, periodicity and quality specification (amplitude weighting), can be stored by the control in a measurement log (step 119B) and/or output on the display (step 119C).

Figure 5:
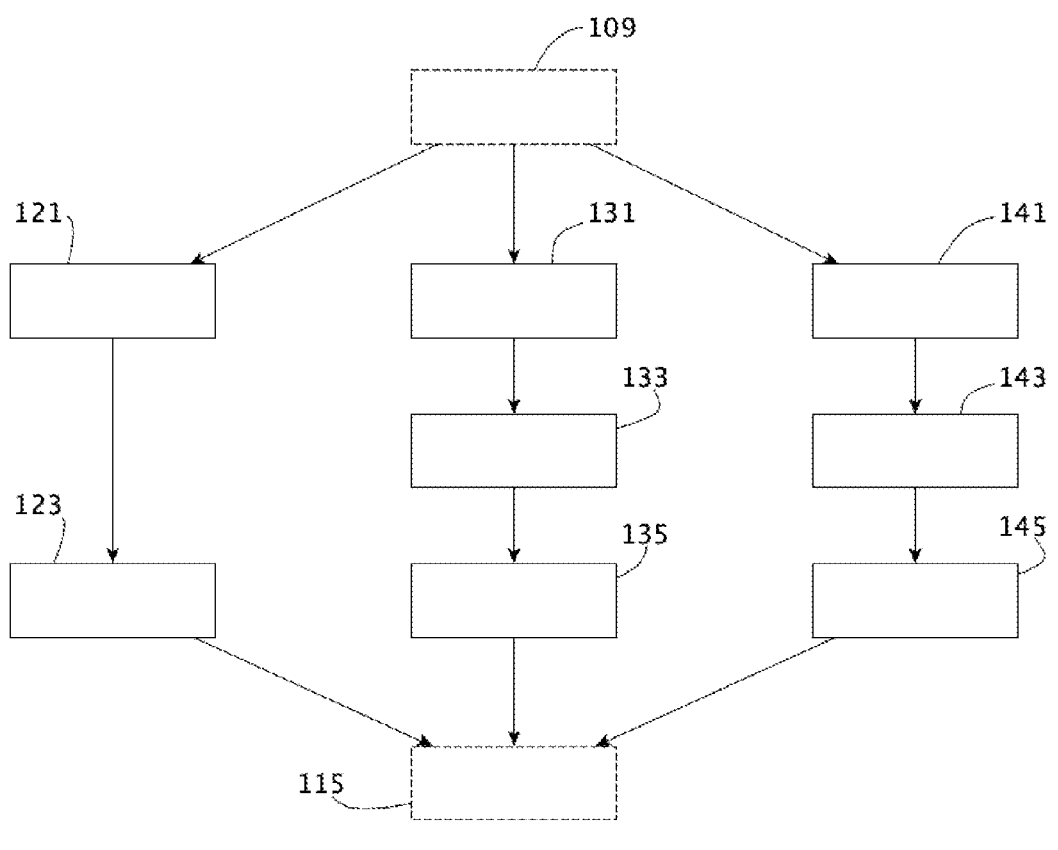
FIG. 5 is a schematic flow chart explaining exemplary implementations for identification of the fundamental oscillation.

FIG. 5 shows a schematic flow chart of exemplary implementations for fundamental oscillation identification (step 113 in FIG. 4). The identification of the fundamental oscillation starts from step 109, in which, for example, in a target time window corresponding to the monitored cable length, measurement data is permanently recorded digitally in the cyclic memory that, whereby windowing can be performed for signal processing.

To identify a dominant oscillation in a first variant (in the time domain), the permanent evaluation can continuously determine zero crossings and/or peak values for the measurement data stored in the cyclic memory (step 121) and note their positions in the memory (and/or alternatively associated difference values). These can, for example, be forwarded and processed as a running index stack. For example, the underlying frequencies of one/several dominant oscillations ("fundamentals") can be identified from the index stack using the given time base (sampling rate) (step 123).

As explained in connection with FIG. 4, the identified frequencies can be checked for the best possible approximation via a correlation using the cyclic memory and the original measurement data. If a fitting fundamental frequency is found and this fundamental frequency corresponds to the limiting parameters of the test specimen, which are given on the basis of the expected or suitable cable length, the identified fundamental frequency can be added to a measurement report.

In general, it is often not trivial to correctly delimit a periodicity, e. g., at the zero crossing. The variants of Fourier analysis or spectral wavelet analysis described below can avoid weaknesses in the evaluation in the time domain and remove interfering harmonic components from the evaluation.

To identify several dominant oscillations in a second variant (in the frequency domain), the permanent evaluation can-starting from step 109—transform the windowed signal by means of a discrete Fourier transformation into a frequency spectrum with respect to the basis of a sinusoidal oscillation (step 131—"discrete Fourier transformation into frequency domain"). In the frequency domain, this results in a weighting of possible dominant sinusoidal amplitudes.

A selection of dominant (sinusoidal) oscillations (oscillation frequencies) can be made on the basis of an amplitude evaluation (step 133—"identifying one or more dominant frequencies in frequency domain"). The identified frequencies can be transformed back (step 135—"inverse Fourier transformation") and, in the time domain, superimposed as a dominant oscillation (transient) onto the measurement signal. Using the measurement data stored in the cyclic memory, the identified frequencies/dominant oscillations can be checked for the best possible approximation via a correlation (steps 115 and 117 in FIG. 4). If a fitting fundamental oscillation is found and this corresponds to the limiting parameters of the test specimen, which are given on the basis of the expected or fitting cable length, the identified fundamental oscillation can be added to the measurement report.

To identify several dominant oscillations in a third variant (in the "spectral range"), the permanent evaluation can-starting from step 109—transform the windowed signal by means of a continuous wavelet transformation into a spectrum with respect to the basis of expected (typical) and predefined waveforms (step 141—"continuous wavelet transformation"). In the spectrum, there is given a relative weighting of possible dominant oscillations (pattern matching).

A selection of dominant characteristics can be made (step 143—"identifying one or more dominant matches in spectrum"), these can be transformed into the time domain (step 145—"transforming identified matches into time domain") and, in the time domain, superimposed as a dominant oscillation (transient) onto the measurement signal. Using the measurement data stored in the cyclic memory, the identified frequencies can be checked for the best possible approximation via a correlation (steps 115 and 117 in FIG. 4). If a fitting fundamental frequency is found and this corresponds to the limiting parameters of the test specimen, which are given on the basis of the expected or fitting cable length, the identified fundamental frequency can be added to the measurement report.

Dominant fundamental oscillations can be identified, for example, using one of the three methods described above. These can be provided, in addition to the evaluation of the tangent-delta-measurement, in the computing unit of the testing device 1 (in particular in the measurement and evaluation unit 9, whereby the evaluation steps can be implemented on one or more computing modules.

Figure 6:
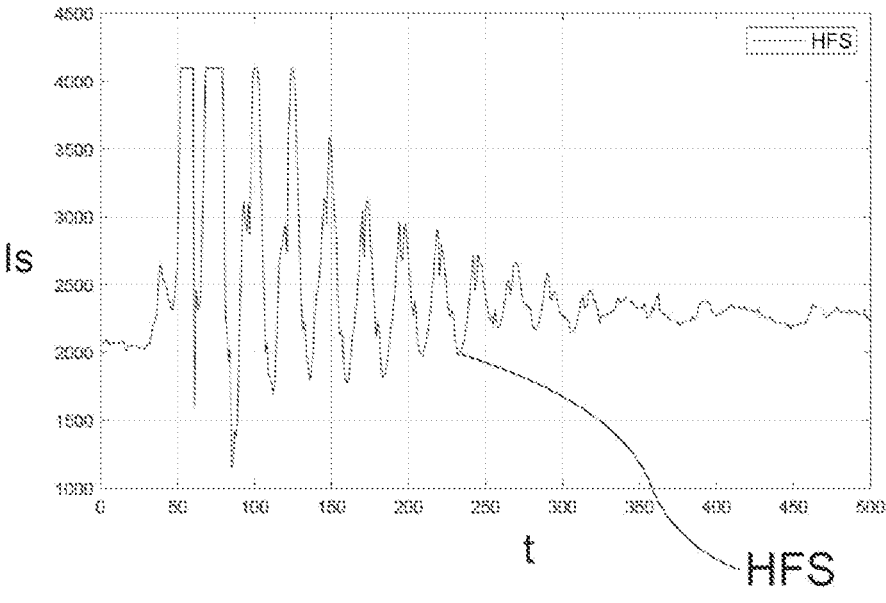
FIG. 6 is a measurement data set of an exemplary recorded pre-location signal of a measurement.

FIG. 6 shows a high-frequency signal HFS (signal strength Is plotted against time t in an input signal time section/windowing) for an exemplary measurement data set, which was stored in the buffer memory after digitizing a pre-location signal recorded at the high-frequency signal pick-up. One can recognize a fundamental oscillation in the MHz frequency range, which decays after the breakdown, as well as additional higher frequency components in the form of modulations of the fundamental oscillation. The high-frequency signal HFS can be used for an evaluation in the time domain. For example, using zero-crossing or peak value detection, one or more oscillations can be determined automatically or manually (e. g., by setting a cursor at a displayed graph) via the time difference between two positions.

A large number of modulations can make it difficult to precisely determine the fundamental oscillation in the time domain, in particular can cause an inaccuracy in the identification of zero crossings and maximum values within the graphical evaluation. (For evaluation in the time domain, see also the preceding description of FIG. 4.) In the time domain, often only one oscillation is determined, as overlapping oscillations are not always directly recognizable.

Figure 7:
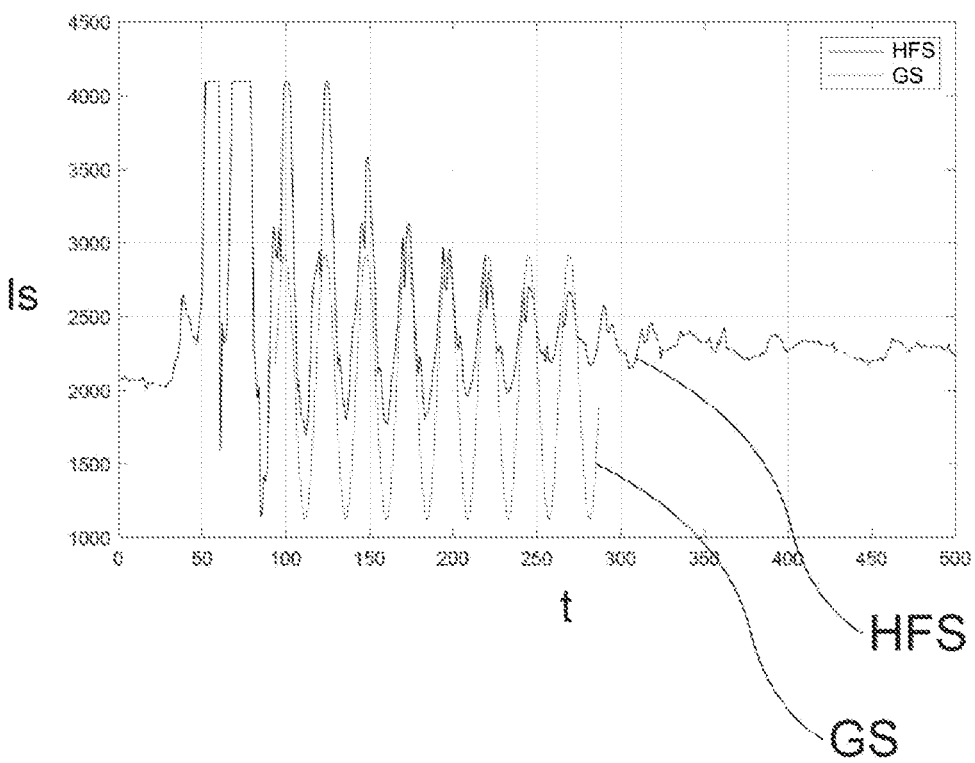
FIG. 7 is a sketch for illustrating an exemplary evaluation and correlation in the time domain.

FIG. 7 shows the high-frequency signal HFS of FIG. 6 with a superimposed fundamental oscillation GS of the oscillation, whereby the frequency of the fundamental oscillation GS was obtained, for example, from an evaluation in the frequency domain. The correlation between the fundamental oscillation GS and the high-frequency signal HFS is a parameter for the quality indication of the identified fundamental oscillation GS.

Figure 8:
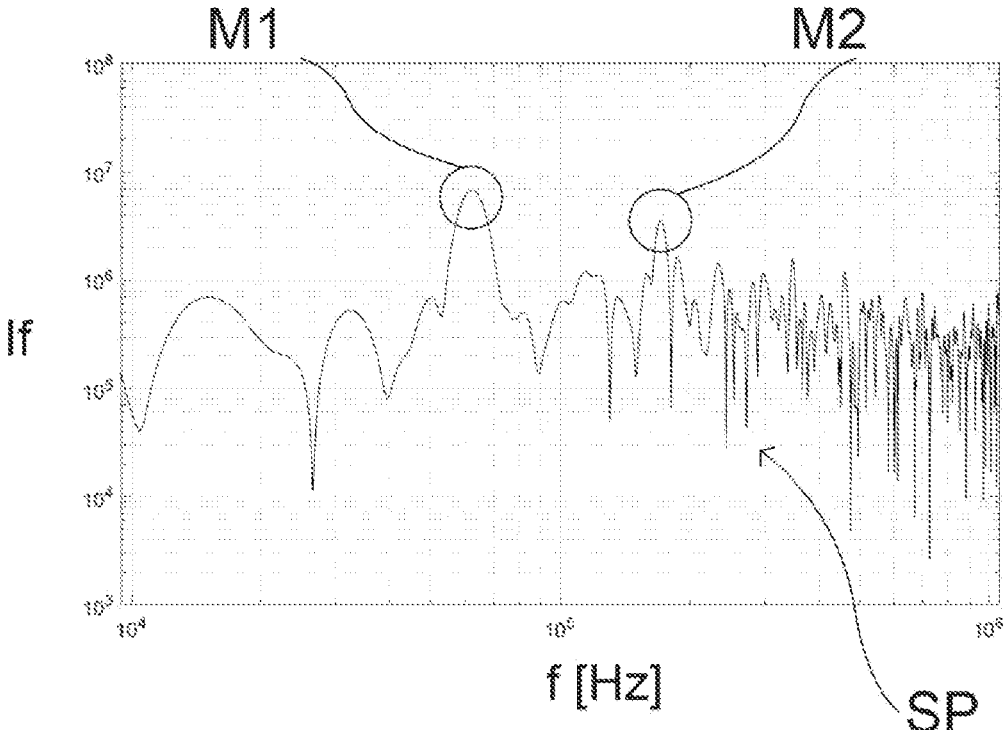
FIG. 8 is a sketch for illustrating an exemplary evaluation in the frequency range.

FIG. 8 illustrates an evaluation of the fundamental oscillation of the high-frequency signal HFS of FIG. 5 over a frequency spectrum SP, i.e., in the frequency range (frequency strength If plotted over frequency f in a frequency range relevant for the test specimen). In general, the high-frequency signal HFS (and/or possibly the pre-location signal) can be processed manually or automatically according to the length of the cable stretch and/or the propagation speed (signal processing, windowing) before it is transformed into the frequency range. As an example, two frequency maxima M1, M2 for two dominant oscillations were marked in the frequency spectrum SP. During a correlation check, the frequency of the maximum M1 turned out to be incorrect. The frequency of the maximum M2 was superimposed on the high-frequency signal HFS in FIG. 6 and corresponds to the frequency of the fundamental oscillation, which allows conclusions to be drawn about the distance of the defect in the context of defect pre-location.

It should be noted that the result of the defect pre-location does not necessarily have to represent a defect in the isolation. Rather, the result is a probability. If a cluster of certain defect distances forms around a location during the measurement, i.e., as part of the continuous monitoring and evaluation, this can be seen as an indication of a real defect in the insulation or that a defect will soon form.

If the evaluation indicates a defect in the insulation at a real defect distance, as reaction, a new measurement can be continued for confirmation in the sense of unique identification. Alternatively, the result of the evaluation can cause the control to abort the VLF-test prematurely to protect the cable, so that the maximum voltage of the tangent-delta-measurement, which is usually in the range of 2 to 3 times the line voltage U0, is not reached. In this way, the test specimen can be treated with care and, for example, the hardening of defects or a breakdown can be avoided.

The defect location methods described herein relate in particular to cable defects with high resistance or transiently forming defects. In the methods, measurements are performed on a current signal that flows through a connected test specimen (Device Under Test, DUT; power cable, coaxial cable, . . . ). If, for example, a breakdown occurs in the test specimen, this triggers a transient wave (oscillation), the frequency/period duration of which is proportional to the distance of the breakdown. As the test specimen as a power cable is usually connected directly to protective earth at the shield, it is suggested that the current is recorded at a suitable point within the VLF HV generator—at the so-called IE collection point (internal earth potential).

Within the knowledge of the person skilled in the art, the features of the methods and devices used in the present description, which are referred to as "unit", "device" or the like, may be implemented, for example, as discrete physical units/entities, as conceptual functional units/entities, for example, as software code (within an evaluation program) stored in a storage unit (memory), as routines of a microprocessor and/or within a hybrid hardware/firmware structure. In addition, two or more "units" etc. may be integrated together in a single physical circuit structure (e. g., an integrated unit or structure). For example, a processor may be controlled by programming code (stored instructions), wherein the programming code is capable of executing the respective functions when executed by a processor, such as a microprocessor.

The features disclosed herein can thus be configured as software, hardware, and/or a combination of hardware and software. Specific details of the individual units are described in the description (and in particular in the exemplary sections). These provide a person skilled in the art with sufficient information to implement the corresponding structures in hardware circuits or software code. As an example, the "evaluation unit" disclosed herein may be embodied in the structure of a central processing unit (CPU) that is configured with instructions to perform the operations to derive information on the fundamental oscillation. The CPU may comprise one or more microprocessors in conjunction with one or more memory elements. A memory element may store one or more microprocessor-readable instructions (programs) that, when executed by the microprocessor, perform, for example, the Fourier or wavelet transformation. In addition, the measurement and evaluation unit 9 and the control may comprise different units that interact with each other to perform the desired actions such as receiving, accessing, and/or sending data sets, identifying maxima, etc.

It is explicitly emphasized that all features disclosed in the description and/or claims are to be considered separate and independent of each other for the purpose of the original disclosure as well as for the purpose of limiting the claimed invention, regardless of the combinations of features in the embodiments and/or claims. It is explicitly stated that all range indications or indications of groups of units disclose any possible intermediate value or subgroup of units for the purpose of the original disclosure as well as for the purpose of limiting the claimed invention, in particular also as the limit of a range indication.

What is claimed is:

1. A testing device for testing a high or medium voltage cable using a very low frequency (VLF) testing method, comprising:

a circuit arrangement with a test voltage generator that comprises a low voltage side earthing input and a high voltage side output and is configured to provide a variable test voltage at the high-voltage-side output, a power connection for connecting the test voltage generator to a supply voltage source, a test specimen connection for connecting the high voltage side output to a conductor of the high or medium voltage cable, a protective earth connection for connecting to a protective earth, a connecting conductor that electrically connects the low-voltage-sidelow voltage side earthing input to the protective earth connection, so that the connecting conductor represents a current collection point through which a measuring current flows during the test of the high or medium voltage cable, which current is formed between the low voltage side earthing input and a shield of the high or medium voltage cable, which shield is also connected to the protective earth, a low frequency signal pick up at the current collection point, at which a low frequency diagnostic signal is generated based on the measuring current, and a high frequency signal pick up at the current collection point, at which a high frequency pre location signal for a measurement of a transient high frequency oscillation is generated based on the measuring current, and an evaluation electronics that is connected to the low frequency signal pick up for receiving the low frequency diagnostic signal and is configured for a VLF phase rotation measurement, and is connected to the high frequency signal pick up for recording the high frequency pre location signal and is configured for defect distance evaluation.

2. The testing device of claim 1, wherein the circuit arrangement is configured to, using the variable test voltage, simultaneously generate the low frequency diagnostic signal for an insulation test of the high or medium voltage cable via the VLF phase rotation measurement and the high frequency pre location signal for defect pre location via the measurement of transient high frequency oscillations, and/or wherein the low voltage side earthing input is only connectable to the protective earth via the connecting conductor.

3. The testing device of claim 1, wherein the high frequency signal pick up comprises an electrical and/or magnetic coupling with the connecting conductor and the coupling is configured to detect the pre location signal with frequencies in the range from 20 kHz to 2 MHz with a sampling rate with frequencies in the range from 1 MHz to several 100 MHz.

4. The testing device of claim 3, wherein the magnetic coupling is configured as one of an inductive coupling, a coil, a Rogowski coil, a coil with an inductive core, and a coil without an inductive core, and/or wherein the high frequency signal pick up is arranged to continuously detect a high frequency current oscillation in the connecting conductor, and the high frequency current oscillation is detectable during a breakdown of an insulation in the high or medium voltage cable or a high frequency current oscillation is detectable, which is associated with an impending breakdown.

5. The testing device of claim 1, wherein the evaluation electronics is configured to derive, from the pre location signal, a distance value associated with the high frequency current oscillation, to evaluate the distance value with respect to a plausibility, taking into account a known parameter of the high or medium voltage cable, and to output a defect distance value associated with the high or medium voltage cable.

6. The testing device of claim 1, wherein the test voltage generator generates the test voltage for a tangent delta measurement, and the low frequency signal pick up is configured to detect an instantaneous value of a current in the connecting conductor, and/or comprises an impedance in the connecting conductor, in particular or a parallel circuit of resistor and capacitor.

7. The testing device of claim 6, wherein the evaluation electronics is configured to determine, from the diagnostic signal, a loss factor associated with the high or medium voltage cable, and is configured to detect low frequencies of the diagnostic signal in the range from 0.01 Hz to 1 Hz with a sampling rate with frequencies in the range from 500 Hz to 10 kHz.

8. The testing device of claim 1, wherein the evaluation electronics comprises at least one analog and/or digital signal processing unit and/or a processor and/or a buffer memory.

9. The testing device of claim 1, wherein the testing device further comprises a control with a memory and a display, wherein the control is connected to the evaluation electronics and is set up to store a defect distance value in the memory, to output it on the display and/or to use a defect distance value as a control parameter for controlling the testing device.

10. The testing device of claim 1, wherein the testing device further comprises a housing in which the circuit arrangement and the evaluation electronics and optionally a control are arranged.

11. A method for testing a high or medium voltage cable using a testing device according to claim 1, comprising the steps of:

connecting a conductor of the high or medium voltage cable to a test specimen connector of the testing device, wherein a shield of the high or medium voltage cable is connected to a protective earth, generating a very low frequency (VLF) test voltage with a test voltage generator of the testing device and coupling the VLF test voltage into the high or medium voltage cable, measuring a transient high frequency oscillation with a high frequency signal pick up at a current collection point of the high voltage source, wherein a high frequency pre location signal is generated based on a measuring current flowing through the current collection point, and evaluating the high frequency pre location signal in an evaluation electronics of the testing device with regard to a defect distance.

12. The method of claim 11, wherein the evaluation with respect to the defect distance for detecting traveling waves, which are triggered by a defect in the high or medium voltage cable, is performed by a processor and comprises the following steps:

continuous sampling and windowing of the pre location signal, wherein a continuous measurement data set is generated, storing temporarily the measurement data set in a cyclical memory, identifying a plurality of dominant oscillations in the measurement data set, correlating the identified dominant oscillations with the temporarily stored measurement data set, and checking a plausibility of at least one selected identified dominant oscillation for the high or medium-voltage-medium voltage cable.

13. The method of claim 11, wherein the processor for identifying the plurality of dominant oscillations is at least one of configured to:

recognize zero crossings and/or peak values in the measurement data set, and/or to have the measurement data set displayed by a display and to read zero crossings and/or peak values determined by an operator, and from the zero crossings and/or peak values, derive a dominant oscillation for correlation with the temporarily stored measurement data set;

configured to:

apply a discrete Fourier transform to the measurement data set and generate a transformed measurement data set in the frequency domain, recognize at least one dominant oscillation frequency, transform the at least one dominant oscillation frequency back into the time domain, and derive it as at least one dominant oscillation for correlating with the temporarily sored measurement data set, and configured to:

apply a continuous wavelet transform to the measurement data set, recognize at least one dominant characteristic in the spectrum, transfer the at least one dominant characteristic into the time domain and derive it as at least one dominant oscillation for correlation with the temporarily stored measurement data set.

14. The method of claim 11, wherein the high frequency pre location signal is evaluated with respect to the defect distance such that a defect distance value is calculated for a fundamental oscillation having a plausibility above a threshold value, and/or wherein a parameter associated with the fundamental oscillation, such as oscillation frequency, periodicity and quality specification, and/or the defect distance value is at least one of stored in a memory, saved in a measurement log, output on a display and, fed to a control of the testing device as a control parameter.

15. A method for testing a high or medium voltage cable comprising the steps of:

with a test voltage generator having a high or medium voltage cable connected, causing a measuring current in a connecting conductor, which connects a low voltage side earthing input of the test voltage generator to a protective earth via a protective earth connection, wherein the connecting conductor represents a current collection point, through which the measuring current flows, and the measuring current is formed between the low-voltage-side earthing input and a shield of the high or medium voltage cable, which is also connected to the protective earth, for a VLF phase rotation measurement, generating a low frequency diagnostic signal associated with the measuring current with a low frequency signal pick up at the current collection point, for a defect distance evaluation, generating a high frequency pre locationpre location signal associated with the measuring current with a high frequency signal pick up at the current collection point, the high frequency pre location signal being generated continuously during the VLF phase rotation measurement, and evaluating the high frequency pre location signal in an evaluation electronics with respect to a defect distance.

16. The method of claim 15, wherein the evaluation with respect to the defect distance for detecting traveling waves, which are triggered by a defect in the high or medium voltage cable, is performed by a processor and comprises the following steps:

continuous sampling and windowing of the pre location signal with an analog to digital converter, wherein a continuous measurement data set is generated, storing temporarily the measurement data set in a cyclical memory, identifying a plurality of dominant oscillations in the measurement data set, correlating the identified dominant oscillations with the temporarily stored measurement data set, and checking a plausibility of at least one selected identified dominant oscillation for the high or medium voltage cable.

17. The method of claim 16, wherein the processor for identifying the plurality of dominant oscillations is configured to recognize zero crossings and/or peak values in the measurement data set, and/or to have the measurement data set displayed by a display and to read zero crossings and/or peak values determined by an operator, and from the zero crossings and/or peak values, derive a dominant oscillation for correlation with the temporarily stored measurement data set.

18. The method according to claim 16, wherein the processor for identifying the plurality of dominant oscillations is configured to apply a discrete Fourier transform to the measurement data set and generate a transformed measurement data set in the frequency domain, recognize at least one dominant oscillation frequency, transform the at least one dominant oscillation frequency back into the time domain, and derive it as at least one dominant oscillation for correlating with the temporarily stored measurement data set.

19. The method according to claim 16, wherein the processor for identifying the plurality of dominant oscillations is configured to apply a continuous wavelet transform to the measurement data set, recognize at least one dominant characteristic in the spectrum, transfer the at least one dominant characteristic into the time domain and derive it as at least one dominant oscillation for correlation with the temporarily stored measurement data set.

20. The method of claim 15, wherein the high frequency pre location signal is evaluated with respect to a defect distance such that the defect distance value is calculated for a fundamental oscillation having a plausibility above a threshold value, and/or wherein a parameter associated with the fundamental oscillation, such as oscillation frequency, periodicity and quality specification, and/or the defect distance value is at least one of stored in a memory, saved in a measurement log, output on a display and/or fed to a control of the testing device as a control parameter.

\* \* \* \* \*